United States Patent [19]

Thomas et al.

[11] Patent Number: 4,640,004
[45] Date of Patent: Feb. 3, 1987

[54] METHOD AND STRUCTURE FOR INHIBITING DOPANT OUT-DIFFUSION

[75] Inventors: Michael E. Thomas, Cupertino; Madhukar B. Vora, Los Gatos; Ashok K. Kapoor, Palo Alto, all of Calif.

[73] Assignee: Fairchild Camera & Instrument Corp., Mountain View, Calif.

[21] Appl. No.: 600,163

[22] Filed: Apr. 13, 1984

[51] Int. Cl.$^4$ .......................................... H01L 21/285
[52] U.S. Cl. ................................... 29/590; 29/577 C; 29/559; 427/59; 148/DIG. 34; 357/71
[58] Field of Search ............... 29/577 C, 590; 357/71, 357/67; 427/88, 89

[56] References Cited

U.S. PATENT DOCUMENTS

| | | | |
|---|---|---|---|
| 3,614,547 | 10/1971 | May | 357/71 |
| 3,879,746 | 4/1975 | Fournier | 357/71 |
| 4,180,596 | 12/1979 | Crowder et al. | 427/42 |
| 4,228,212 | 10/1980 | Brown et al. | 427/88 |
| 4,344,223 | 8/1982 | Bulger et al. | 29/557 |

FOREIGN PATENT DOCUMENTS

| | | | |
|---|---|---|---|
| 2911484 | 10/1979 | Japan | 29/591 |
| 0080144 | 7/1981 | Japan | 29/591 |

OTHER PUBLICATIONS

Thin Solid Films, vol. 52, pp. 415-437, 1978, "Diffusion Barriers in Thin Films", M-A, Nicolet.
Thin Solid Films, vol. 60, pp. 237-247, 1979, "TiN as a Diffusion Barrier in Ti-Pt-Au", W. J. Garceau et al.
"Interfacial Reactions Between Aluminium and Transition-Metal Nitride and Carbide Films", Wittmer, pp. 1007, 1010-1012, Journal of Applied Physics, vol. 53, No. 2, Feb. 1982.
"Arsenic Out-Diffusion During TiSi$_2$ Formation", Amano et al, pp. 744-746, Applied Physics Letters, vol. 44, No. 8, Apr. 15, 1984.
"Arsenic Distribution in Bilayers of TiSi$_2$ on Polycrystalline Silicon During Heat Treatment", Ostling et al, pp. 281-289, vol. 110, Thin Solid Films, 1983.
"Phosphorus Out Diffusion From Double-Layered Tantalum Silicide/Polycrystalline Silicon Structure", Maa, et al, pp. 1-5, Journal of Vacuum Society Technology B1, No. 1, Jan.-Mar., 1983.
"High-Temperature Contact Structures for Silicon Semiconductor Devices", Wittmer, pp. 540-542, Applied Physics Letters, vol. 37, No. 6, Sep. 15, 1980.
TiN and TaN as Diffusion Barriers in Metallizations to Silicon Semiconductor Devices, Wittmer, pp. 456-458, Applied Physics Letters, vol. 36, No. 6, Mar. 15, 1980.
"TiN Formed by Evaporation as a Diffusion Barrier Between Al and Si", Ting, pp. 14-18, Journal of Vacuum Science Technology, vol. 21, No. 1, May/Jun. 1982.
"Pressure Dependence of the Electrical Properties of TaN Thin Films", Shioyama, et al, pp. 45-48, Thin Solid Films, 57 (1979).
"Electrical and Structural Properties of Tantalum Nitride Thin Films Deposited by Sputtering", Petrovic et al, pp. 333-336, Thin Solid Films, 57 (1979).
"Thermal Oxidation and Resistivity of Tantalum Nitride Films", Brady et al, pp. 287-302, Thin Solid Films, 66 (1980).

Primary Examiner—Brian E. Hearn
Assistant Examiner—Tuan Quach
Attorney, Agent, or Firm—Carl L. Silverman; David H. Carroll; William H. Murray

[57] ABSTRACT

A method for inhibiting out-diffusion of dopants from polycrystalline or single crystal silicon substrates of high speed semiconductor devices into metal silicide conductive layers disposed on the substrate comprises interposing a refractory metal nitride layer between the doped silicon substrate and the refractory metal silicide conductive layer. Dopant out-diffusion is further retarded, and contact resistance lowered, by adding a thin layer of refractory metal between the refractory metal nitride layer and the silicon substrate.

29 Claims, 4 Drawing Figures

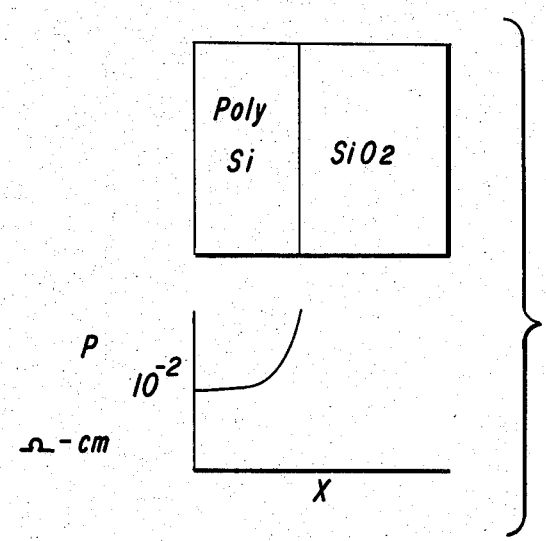
FIG.4A
PRIOR ART
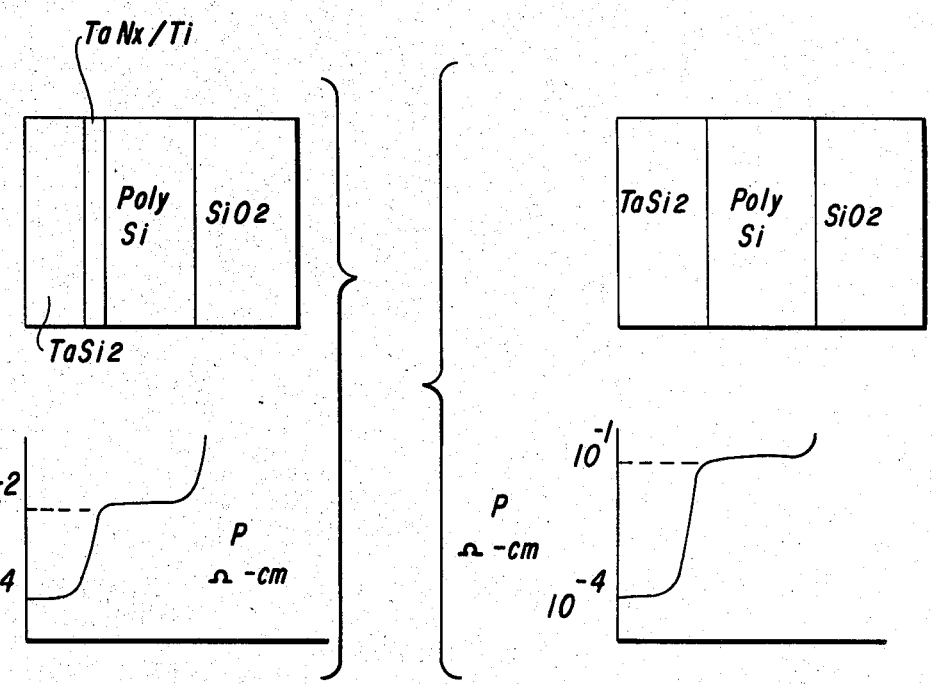
FIG.4C
PRIOR ART
FIG.4B

METHOD AND STRUCTURE FOR INHIBITING DOPANT OUT-DIFFUSION

BACKGROUND OF THE INVENTION

The present invention relates generally to processes for fabrication of semiconductor integrated circuit devices and more particularly to a process for inhibiting out-diffusion of dopants from polycrystalline or single crystal silicon substrates.

The use of advanced semiconductor processing techniques, for example improved etching and photolithographic procedures, has enabled the reduction in the dimensions of semiconductor devices and a concomitant increase in their operating speed. However, this reduction in dimensions has caused a corresponding decrease in the cross-sectional area of interconnect regions which in turn has caused an increase in interconnection time delay resulting from material and circuit parameters.

One solution to this increase in interconnection time delay is set forth in U.S. Pat. No. 4,180,596, issued Dec. 25, 1979 to Crowder et al. This solution comprises a method of placing a metal silicide layer on top of a doped polycrystalline silicon substrate in order to lower the sheet resistance of the polycrystalline silicon interconnections and gain increased circuit speed.

Although the addition of the metal silicide layer on top of the polycrystalline layer lowers sheet resistance causing an increase in circuit speed, the dopants introduced into the polycrystalline silicon substrate tends to diffuse out from the substrate into the metal silicide layer during subsequent annealing and/or oxidation of the device. This causes the underlying polycrystalline silicon layer to become highly resistive; which, in turn makes the contact properties uncontrollable and creates undesirable effects on the operation of a device.

A deleterious effect of this out-diffusion of the dopant from the polycrystalline silicon substrate into the metal silicide layer is shown in FIG. 1. As diagrammatically depicted in FIG. 1A, a conduction layer 100 of a refractory metal silicide is formed by, for example, by co-depositing an amorphous layer of tantalum and silicon on a polycrystalline silicon (poly Si) substrate 102 which has been doped with boron in this example. After annealing at 950° C. for one hour in hydrogen, the conductive layer 100 is converted into tantalum disilicide (Ta Si$_2$). However, as diagrammatically represented by region 104 in FIG. 1B, boron depletion occurs at the tantalum disilicide/poly Si interface. As the boron diffuses into the tantalum disilicide layer 100, the interfacial region goes from p+ (represented diagrammatically by region 106 in FIG. 1B) to p− (represented by region 104) and the diode series resistance becomes excessively high. A similar effect occurs in the case of polycrystalline silicon base transistors where the base resistance increases due to boron out-diffusion to intolerably high levels, rendering the device inoperable. This phenomena is shown in FIG. 1C which depicts a plot of resistivity as a function of distance from the surface of the device (resistivity/depth profile). As can be seen by the dotted curve, which sets forth the resistivity/depth profile after the annealing process, the resistivity at the disilicide/poly Si interfacial region increases substantially over that plotted for the initial profile.

FIG. 2 shows the deterioration in performance of the diode characteristics of a semiconductor device which experiences this dopant out-diffusion. As can be seen in FIG. 2A, the dopant out-diffusion (represented by arrow "d") manifests itself as a resistance R in series with the diode. This causes a degradation in the characteristic current versus voltage curve of the device as shown in FIG. 2B.

SUMMARY OF THE INVENTION

It is therefore an object of the present invention to provide a high speed semiconductor device which does not exhibit the aforementioned degraded performance characteristics.

It is another object of the present invention to prevent the aforementioned degraded characteristics by inhibiting dopant out-diffusion.

It is a further object of the present invention to provide a high speed semiconductor device having a refractory metal silicide layer into which diffusion of dopant from the silicon substrate is inhibited.

It is yet another object of the present invention to provide a method of inhibiting out-diffusion of dopant from a silicon substrate into a refractory metal silicide conductive layer.

These and other objects which will become apparent are achieved in accordance with the present invention by interposing a refractory metal nitride layer between the doped silicon substrate and the refractory metal silicide conductive layer. This intermediate layer inhibits dopant out-diffusion and silicon transport, thereby maintaining a low value of silicon diode series resistance and base resistance of silicon transistors fabricated utilizing silicide conductive layers.

In a further embodiment of the present invention, a thin layer of refractory metal is disposed on the silicon substrate prior to deposition of the refractory metal nitride layer which is interposed between the doped silicon substrate and the refractory metal silicide conductive layer, in order to further retard dopant out-diffusion and lower contact resistance.

Other objects, features and advantages of the present invention will become more fully apparent from the following detailed description of the preferred embodiment, the appended claims and the accompanying drawing.

BRIEF DESCRIPTION OF THE DRAWING

FIG. 4 is a plot of resistivity versus distance from the surface in a prior art device as well as a device constructed in accordance with the present invention.

DETAILED DESCIPTION OF THE PREFERRED EMBODIMENT

Figure 1A:
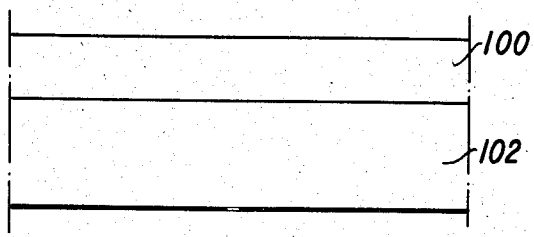
FIG. 1 is a diagrammatic representation of a prior art device having a refractory metal silicide conductive layer as well as plot of resistivity versus distance from the surface of such a prior art device both before and after annealing.
Figure 1B:
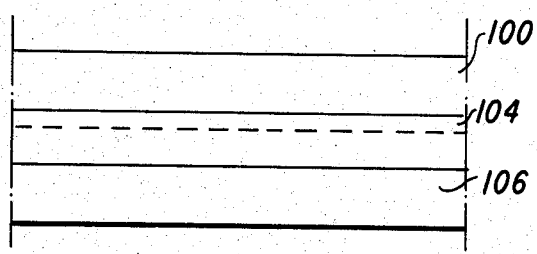
Figure 1C:
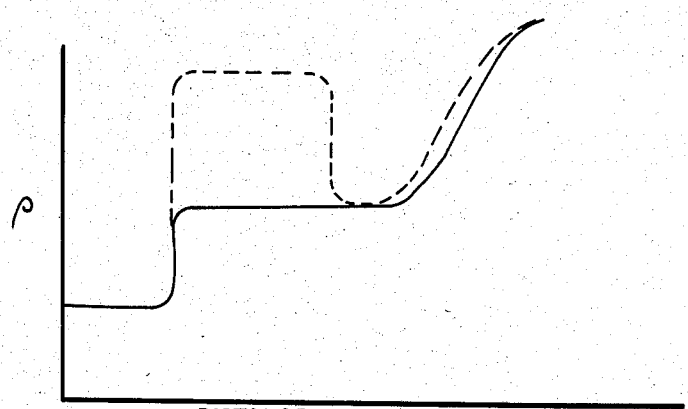
Figure 2A:
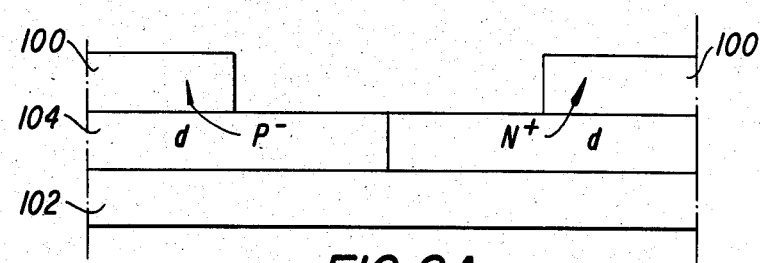
FIG. 2 is a diagrammatic representation of a polycrystalline silicon diode constructed in accordance with the prior art technique as well as a plot of the expected and actual characteristic curves of such a device.
Figure 2B:
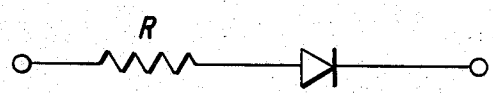
Figure 2C:
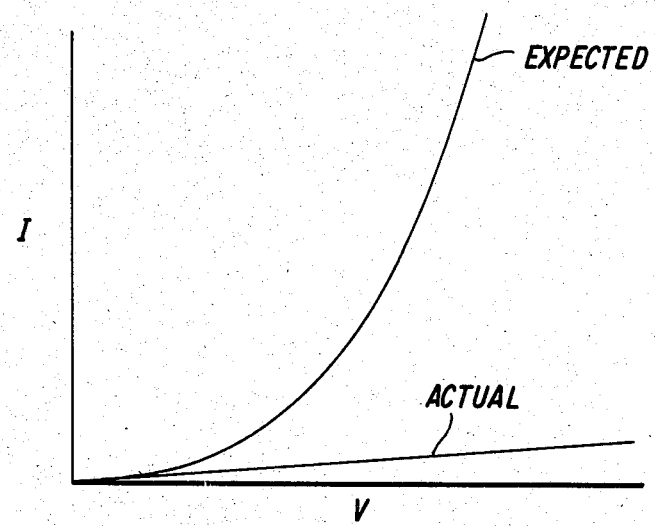

Although specific forms of the invention have been selected for illustration in the drawing, and the following description is drawn in specific terms for the purpose of describing these forms of the invention, this description is not intended to limit the scope of the invention which is defined in the appended claims.

Figure 3A:
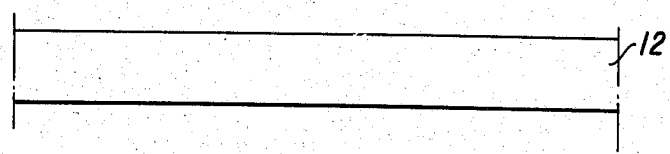
FIG. 3 is a diagrammatic representation of the preferred method for constructing a device in accordance with the present invention.
Figure 3B:
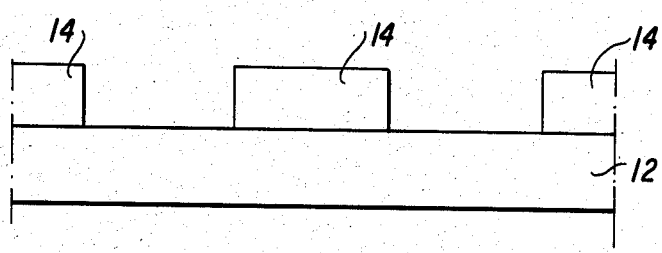

Referring to FIG. 3A, there is shown, in diagrammatic form, a layer 12 of P-type polycrystalline type silicon (poly Si) which forms a substrate for a device made in accordance with the process of the present invention. The poly Si substrate 12 is fabricated by conventional growth techniques in the presence of a p-type dopant such as boron. Although the preferred embodiment includes a polycrystalline silicon substrate, a single crystal silicon substrate may be used and such a substrate is considered within the scope of the present invention. As shown in FIG. 3B, islands 14, of silicon dioxide ($SiO_2$) are formed on the polycrystalline silicon substrate 12 in accordance with well known prior art techniques such as deposition or growth. Note that in the preferred embodiment set forth in this detailed description, the dopant is boron. However, the dopant could also be phosphorous arsenic or antimony.

Figure 3C:
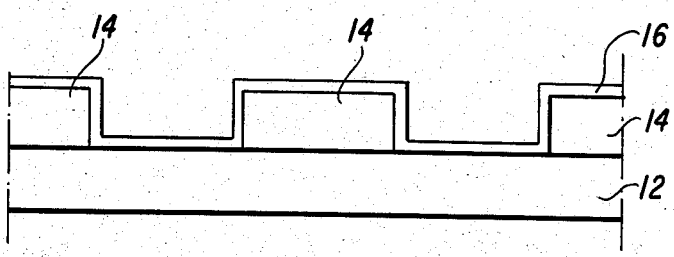

As shown diagrammatically in FIG. 3C, a thin layer 16 of titanium (Ti) is disposed on the substrate 12 and islands 14 by conventional techniques such as physical or chemical vapor deposition. It is preferred that this layer 16 be on the order of 50 Å in thickness. Although the use of titanium is preferred, the layer could also be formed using other refractory metals such as tantalum, niobium, zirconium, chromium or hafnium. The layer 16 has been found to lower contact resistance by breaking down the thin native oxide layer formed on the polycrystalline silicon, after an elevated thermal heat treatment at 950° C. for thirty minutes in hydrogen. This native oxide layer, which forms on the polycrystalline silicon after wet processing, inhibits good contact resistance if not removed or dissolved. Use of the layer 16 has been shown to reduce contact resistance to a value on the order of 10 to 20 ohms for contact windows having an area of 25 square microns. In addition, the layer 16 is so thin that any dopant out-diffusion into the layer is spatially minimal thereby precluding adverse effects of any consequence on the dopant profile of the device.

Figure 3D:
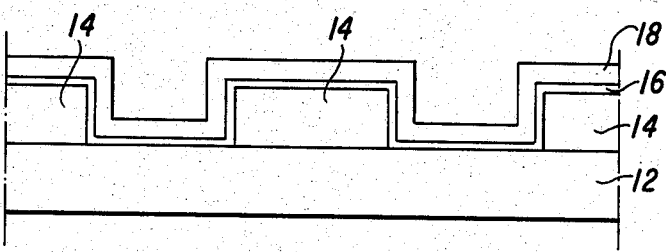

Referring now to FIG. 3D, a blanket layer 18 of tantalum nitride (Ta Nx) is preferably deposited over the titanium layer 16 by reactive evaporation or sputtering, preferably to a thickness of from about 200 Å to 1000 Å. It is preferred that the concentration of nitrogen in the ambient during this reaction process be typically in the range of from approximately $1 \times 10^{-6}$ torr to $1 \times 10^{-2}$ torr. The pressure should be tuned to the deposition rate of the refractory metal, which is tantalum in this preferred embodiment, to ensure a fairly complete reaction of the tantalum with nitrogen. Other nitrogen bearing gases, such as ammonia, could be used in this process as a substitute for nitrogen. In addition, other refractory metals such as niobium, titanium, zirconium, chromium or hafnium could be used to form refractory barrier layers such as niobium nitride (NbN), titanium nitride (TiN), zirconium nitride (ZrN) or hafnium nitride (HfN). The blanket layer 18 may also be deposited using chemical vapor or plasma deposition techniques.

Figure 3E:
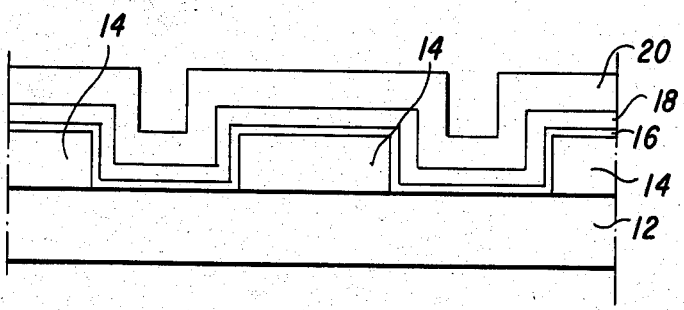

Referring now to FIG. 3E an amorphous co-deposited tantalum: silicon (Ta:Si) layer 20, preferably having a thickness on the order of 2500 Å, is disposed on the tantalum nitride layer 18 without breaking vacuum. This process ensures a clean, oxide free interface between the nitride and amorphous silicide layers, 18 and 20 respectively, thereby minimizing contact resistance between the silicide and nitride phases. It is preferred that the atomic ratio of silicon to tantalum in the co-deposit be in a range of from approximately 2:1 to approximately 4:1, the preferred ratio being approximately 2.5:1.

Figure 3F:
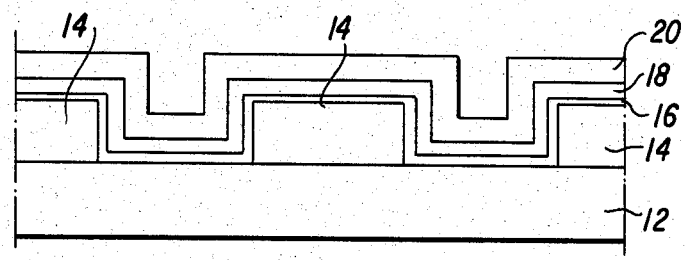

Referring to FIG. 3F, the Ta:Si/TaNx/Ti/poly Si structure is then annealed, preferably by heating at 950° C. for 30 minutes in hydrogen, in order to transform the amorphous Ta:Si layer 20 to tantalum disilicide $TaSi_2$ and stabilize the interface between the disilicide and nitride layers 20 and 18 respectively. After transformation, the tantalum disilicide ($TaSi_2$) layer also contains pure Si grains which have nucleated from the amorphous layer 20 after the reaction. After plasma definition, this excess silicon can later be consumed during oxidation without generating voids in the newly formed $TaSi_2$ layer 20. It has been found that the excess silicon does not substantially change the resistivity of the disilicide layer.

Although in the preferred embodiment a tantalum disilicide layer 20 is formed on the metal nitride layer 18, the layer 20 may alternatively be formed using a refractory metal such as molybdenum, tungsten or tantalum. Such a layer enables one to interconnect areas with lower resistivity pure metals instead of metal disilicides which require stricter control in their processing. Due to the inclusion of the metal nitride layer 18 in accordance with the present invention, the refractory metal layer 20 can be incorporated into the device without forming silicides, since the metal nitride layer blocks silicon transport and retains the chemical integrity of the metal without consumption of silicon from the underlying substrate. This leaves the silicon device characteristics intact.

Figure 3G:
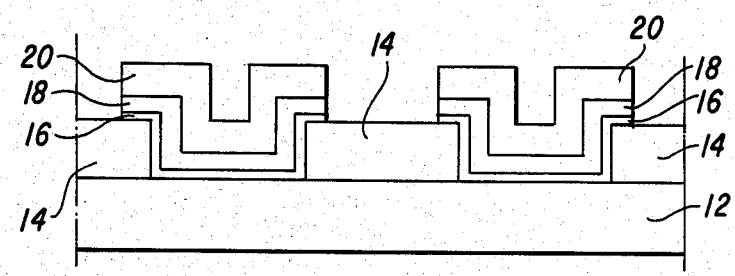

Referring now to FIG. 3G, the structure is then photolithographically masked with photoresist and the $TaSi_2/TaNx/Ti$ tri-layer structure is dry etched preferably in a flourine based plasma. With good end point detection, the etch can be made to stop on the polycrystalline silicon layer 14 as shown in FIG. 3G. Depending on the device application, the poly Si layer, if desired, can be etched anisotropically with a chlorine based plasma. For example, the poly Si could be etched in an MOS gate application or left intact for bipolar contacts.

Figure 3H:
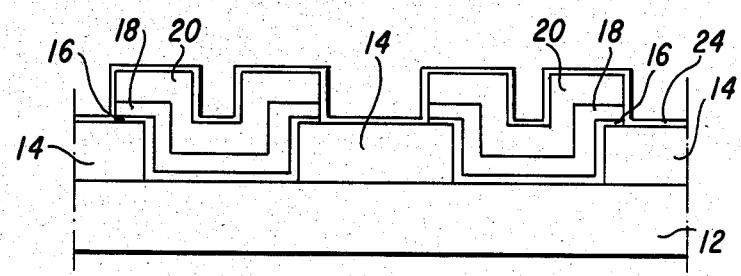
Figure 3I:
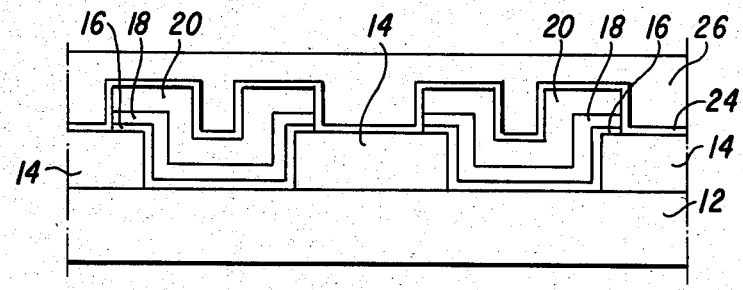

Referring now to FIG. 3H, a thin, thermal $SiO_2$ layer 24 is formed over the structure by high temperature oxidation in a wet $H_2O$ or dry $O_2$ environment. Next, referring to FIG. 3I, the structure is preferably covered with a layer 26 of PVX glass which is then reflowed at a temperature preferably in the range of approximately 825° C.–1000° C. At this point, the device is ready for via generation and other standard back end wafer processes.

Referring now to FIG. 4A, there is shown a resistivity depth profile of a structure comprising a boron doped polycrystalline silicon (poly Si) layer disposed on a silicon dioxide ($SiO_2$) substrate. The resistivity of the poly Si layer of this structure is substantially equal to $10^{-2}$ ohm-cm. FIG. 4B depicts a resistivity depth profile of a device structure comprising the structure depicted in FIG. 4A having a tantalum disilicide ($TaSi_2$) layer disposed on the doped poly Si layer thereof, after being subjected to a typical annealing heat cycle of 1000° C. for thirty minutes. As shown in FIG. 4B, the resistivity of the doped poly Si layer of this structure has increased to approximately $10^{-1}$ ohm-cm from the pre-annealing value of $10^{-2}$ ohm-cm for the structure depicted in FIG. 4A.

FIG. 4C depicts a resistivity depth profile for a device structure of the present invention comprising tantalum nitride (TaNx) and titanium (Ti) layers disposed between the TaSi$_2$ and doped poly Si layers of the device structure depicted in FIG. 4B, after being subjected to the same typical annealing heat cycle of 1000° C. for thirty minutes. The resistivity of the doped poly Si layer of this structure remained substantially equal to the pre-annealing value of $10^{-2}$ ohm-cm for the structure depicted in FIG. 4A. This results in a resistivity which is approximately one order of magnitude lower than that of the doped poly Si layer of the prior art device. Furthermore, as the annealing time increases, the resistivity of the poly Si layer of the prior art device will continue to increase while the resistivity of the poly Si layer of the device of the present invention will remain substantially unchanged at approximately $10^{-2}$ ohm-cm.

It will be understood that various changes in the details, materials and arrangement of the parts which have been herein described and illustrated in order to explain the nature of this invention, may be made by those skilled in the art within the principle and scope of the invention as expressed in the following claims.

We claim:

1. A method of inhibiting dopant out-diffusion in a semiconductor device including a silicon substrate containing a dopant and having a refractory metal silicide layer disposed on at least a portion of one surface thereof, said method comprising the step of disposing a refractory metal nitride barrier layer between said doped silicon substrate and said refractory metal silicide layer.

2. The method in accordance with claim 1 wherein said barrier layer includes a refractory metal selected from the group consisting of tantalum, niobium, titanium, zirconium, chromium and hafnium.

3. The method in accordance with claim 2 wherein said dopant is selected from the group consisting of boron, phosphorus, arsenic and antimony.

4. The method in accordance with claim 3 comprising an additional step of disposing a layer of refractory metal between said barrier layer and said silicon substrate.

5. The method in accordance with claim 4 wherein said refractory metal layer comprises a refractory metal selected from the group consisting of tantalum, niobium, titanium, zirconium, chromium and hafnium.

6. The method in accordance with claim 5 wherein the refractory metal of said barrier layer comprises tantalum.

7. The method in accordance with claim 5 wherein said dopant comprises boron.

8. The method in accordance with claim 5 wherein the refractory metal of said refractory metal layer comprises titanium.

9. The method in accordance with claim 5 wherein the refractory metal of said barrier layer comprises tantalum, the dopant comprises boron and the refractory metal of said refractory metal layer comprises titanium.

10. A method of inhibiting dopant diffusion in a high speed semiconductor device, said method comprising the steps of:

(a) providing a silicon substrate containing a dopant and having a first surface;

(b) disposing a first layer of a first refractory metal over the first surface of said substrate, said first layer having a predetermined thickness;

(c) depositing a second refractory metal on said first layer in an ambient environment having a predetermined concentration of nitrogen in order to form a blanket layer of a refractory metallic nitride having a predetermined thickness;

(d) placing an amorphous, co-deposited third refractory metal: silicon layer, having a predetermined thickness and a predetermined atomic ratio of silicon to refractory metal, on said blanket layer; and (e) transforming said co-deposited layer to a refractory metallic disilicide layer by heating at a predetermined temperature for a predetermined amount of time in a second predetermined ambient environment.

11. The method of claim 10 wherein said dopant is selected from the group consisting of boron, phosphorous, arsenic and antimony.

12. The method of claim 11 wherein said dopant is boron.

13. The method of claim 10 wherein said first, second and third refractory metals are selected from the group consisting of tantalum, titanium, niobium, zirconium, chromium and hafnium.

14. The method in accordance with claim 13, wherein said first refractory metal comprises titanium.

15. The method in accordance with claim 13 wherein said second refractory metal comprises tantalum.

16. The method in accordance with claim 13 wherein said third refractory metal comprises tantalum.

17. The method of claim 16 wherein the thickness of said co-deposited layer is substantially equal to 2500 Å.

18. The method of claim 17 wherein said predetermined atomic ratio of silicon to tantalum is substantially equal to 2.5:1.

19. The method of claim 18 wherein said amorphous tantalum: silicon layer is transformed to tantalum disilicide by heating at a temperature substantially equal to 950° C. for a time substantially equal to 30 minutes in an ambient environment of hydrogen.

20. The method of claim 10 wherein the thickness of said first refractory metal layer is substantially equal to 50 Å.

21. The method of claim 10 wherein the thickness of said blanket layer is in a range of from approximately 200 Å to 1000 Å.

22. The method of claim 10 wherein the concentration of nitrogen is in a range of from approximately $1 \times 10^{-6}$ torr to $1 \times 10^{-2}$ torr.

23. The method of claim 10 comprising the additional steps of:

(a) etching through said metallic disilicide, blanket and first refractory metal layers to said silicon substrate surface in predetermined locations on said first surface;

(b) disposing a layer of silicon dioxide over said etched and non-etched portions;

(c) covering said layer of silicon dioxide with a layer of glass; and (d) reflowing said glass layer at a predetermined temperature.

24. The method in accordance with claim 17 wherein said glass is reflowed at a temperature in the range of from approximately 825° C. to 1000° C.

25. In a semiconductor device including a silicon substrate containing a dopant and having a first refractory metal layer disposed on at least one portion of one surface thereof, a method of blocking silicon transport from said substrate to said first refractory metal layer comprising the step of disposing a refractory metal nitride barrier layer between said substrate and said first refractory metal layer.

26. The method in accordance with claim 25 wherein said barrier layer includes a refractory metal selected from the group consisting of tantalum, niobium, titanium, zirconium, chromium and hafnium.

27. The method in accordance with claim 26 wherein said first refractory metal layer comprises a refractory metel selected from the group consisting of molybdenum, tungsten and tantalum.

28. The method in accordance with claim 27 comprising an additional step of disposing a second layer of refractory metal between said barrier layer and said silicon substrate.

29. The method in accordance with claim 28 wherein said second refractory metal layer comprises a refractory metal selected from the group consisting of tantalum, niobium, titanium, zirconium, chromium and hafnium.

* * * * *